(12) United States Patent
Gee et al.

(10) Patent No.: US 7,170,001 B2
(45) Date of Patent: Jan. 30, 2007

(54) FABRICATION OF BACK-CONTACTED SILICON SOLAR CELLS USING THERMOMIGRATION TO CREATE CONDUCTIVE VIAS

(75) Inventors: James M Gee, Albuquerque, NM (US); Russell R. Schmit, Sandia Park, NM (US)

(73) Assignees: Advent Solar, Inc., Albuquerque, NM (US); Sandia Corporation, Albuquerque, NM (US)

(*) Notice: Subject to any disclaimer, the term of this patent is extended or adjusted under 35 U.S.C. 154(b) by 763 days.

(21) Appl. No.: 10/606,487

(22) Filed: Jun. 26, 2003

(65) Prior Publication Data

US 2004/0261839 A1    Dec. 30, 2004

(51) Int. Cl.
H01L 31/04    (2006.01)
(52) U.S. Cl. ...................... 136/256; 136/252
(58) Field of Classification Search ................ 136/252, 136/256
See application file for complete search history.

(56) References Cited

U.S. PATENT DOCUMENTS

| | | | |
|---|---|---|---|
| 3,903,427 A | 9/1975 | Pack | |
| 3,936,319 A | 2/1976 | Anthony et al. | 136/89 |
| 4,173,496 A | 11/1979 | Chiang et al. | 136/89 |
| 4,184,897 A | 1/1980 | Anthony et al. | 148/1.5 |
| 4,190,852 A | 2/1980 | Warner, Jr. | 357/30 |
| 4,377,423 A | 3/1983 | Anthony | 148/171 |
| 5,468,652 A * | 11/1995 | Gee | 438/98 |
| 6,384,317 B1 * | 5/2002 | Kerschaver et al. | 136/256 |
| 6,559,479 B1 | 5/2003 | Luedemann | |

OTHER PUBLICATIONS

Eikelboom, et al, "Conductive Adhesives for Interconnection of Busbarless Emitter Wrap-Through Solar Cells on A structured Metal Foil", 17th Dur. PV Solar Energy Conf., Munich, Germany, Oct. 2001.
Van Kerschaver, et al, "High Performance Modules Based on Back Contacted Solar Cells", 17th Dur. PV Solar Energy Conf., Munich, Germany, Oct. 2001.
Kray, et al, "High-Efficiency Emitter-Wrap-Through Cells", 17th EU-PVSEC Munich (2001), Oct. 2001.
Knauss, et al, "Emitter WrapThrough Solar Cells using Electronics Plating Metallisation", 17th Dur. PV Solar Energy Conf., Munich, Germany, Oct. 2001.
Smith, et al, "Review of Back Contact Silocon Solar Cells for Low Cost Application", Presented at 16th Durpoean Photovolataic Solar Energy Conference, Glasgow, 2000.

(Continued)

Primary Examiner—Nam Nguyen
Assistant Examiner—Anthony Fick
(74) Attorney, Agent, or Firm—Stephen A. Slusher; Philip D. Askenazy; Robert D. Watson

(57) ABSTRACT

Methods of manufacturing back-contacted silicon solar cells fabricated using a gradient-driven solute transport process, such as thermomigration or electromigration, to create n-type conductive vias connecting the n-type emitter layer on the front side to n-type ohmic contacts located on the back side.

15 Claims, 11 Drawing Sheets

OTHER PUBLICATIONS

Dokhac, et al, "*Al Thermomigration Applied to the Formation of Deep Junctions for Power Device Insulation*", Microelectronics Reliability (1999) 23-27.

Cline, et al, "*High-Speed Droplet Migration in Silicon*", General Electric Research and Development Center, Schenectady, New York 12301, in final form Feb. 6, 1976.

Anthony, et al, "*Random Walk of Liquid Droplets Migration in Silicon*", General Electric Corporate Research and Development Center, Schenectady, New York 12308, in final form Feb. 6, 1976.

Cline, et al, Thermomigration of Aluminum-Rich Liquid Wires Through Silicon, General Electric Corporate Research and Development Center, Schenectady, New York 12301.

* cited by examiner

FABRICATION OF BACK-CONTACTED SILICON SOLAR CELLS USING THERMOMIGRATION TO CREATE CONDUCTIVE VIAS

FEDERALLY SPONSORED RESEARCH

The United States Government has rights in this invention pursuant to Department of Energy Contract No. DE-AC04-94AL85000 with Sandia Corporation.

CROSS-REFERENCE TO RELATED APPLICATIONS

None

BACKGROUND OF THE INVENTION

The present invention relates generally to methods of manufacturing photovoltaic silicon solar cells, and more specifically to back-contacted solar cells fabricated using a gradient-driven migration process, such as thermomigration or electromigration, to create an array of $n^{++}$ conductive vias electrically connecting an $n^+$ emitter surface on the front side of the cell to a grid of ohmic contacts located on the cell's backside.

Back-contacted silicon solar cells (photovoltaic cells) have several advantages compared to traditional silicon solar cells that have ohmic contacts located on both the front and rear surfaces. One advantage is that back-contacted cells have a higher conversion efficiency due to reduced (or eliminated) contact-obscuration losses (e.g., sunlight reflected from a front-side contact grid is unavailable to be converted into electricity). Another advantage is that assembly of back-contacted cells into electrical circuits will be easier, and therefore cheaper, because both polarity contacts are on the same surface (i.e., the back-side). As an example, significant cost savings compared to present photovoltaic module assembly can be achieved with back-contacted cells by encapsulating the photovoltaic module and assembling the solar cells into an electrical circuit in a single step. Another advantage of a back-contacted cell is better aesthetics by providing a more uniform appearance (e.g., an all-black surface). Aesthetics is important for some applications, like building-integrated photovoltaic systems (e.g., solar roof tiles), and photovoltaic sunroofs for automobiles.

An important issue for back-contacted silicon solar cells is identifying a cell design and fabrication process that are inexpensive to manufacture and that can use inexpensive, lower-quality silicon substrates. Solar cells that use inexpensive silicon substrates contain greater amounts of impurities and crystalline defects, which limit the internal collection depth of photo-generated carriers. Hence, silicon solar cells using inexpensive substrates generally have a carrier-collection junction (i.e., "emitter layer") on the front surface, where most of the light is absorbed, in order to obtain a high collection efficiency of photogenerated carriers. For silicon solar cells, the bulk Si substrate is generally doped p-type and the emitter layer is generally a thin, heavily-doped, n+ layer that is formed in an "emitter diffusion" step by solid-state diffusion of phosphorus at elevated temperatures.

State-of-the-art back-contacted solar cells use an array of laser-drilled holes to effectively "wrap" the emitter layer from the front surface around to the back surface (hence, the name "Emitter Wrap Through", or EWT). The laser-drilled holes are closely spaced about 1–2 mm apart, and typically have a diameter of about 50–150 microns (after chemical etching). The emitter diffusion step (i.e., doping with phosphorus) dopes both the exposed exterior front and back silicon surfaces n-type (except for any masked areas), as well as doping the exposed interior silicon surfaces n-type (i.e., n-doped) that are located inside of the hollow laser-drilled holes. The interior n-doped surfaces of the holes form an electrically conductive channel or pathway (i.e., "via") that electrically connects the n-doped emitting front surface to the n-doped rear surface, thereby permitting negative ohmic contacts (i.e., current-collection grids) to be made on the rear surface. n-doping of the laser drilled holes also provides electrical insulation of the conductive via from the p-type bulk semiconductor. Efficient back-contacted solar cells using both photolithographically-defined and screen-printed metallizations have been demonstrated using laser-drilled holes diffused with phosphorus, i.e., in an EWT configuration, as disclosed in U.S. Pat. No. 5,468,652 to Gee, which is incorporated herein by reference. The back-contacted positive and negative grid lines are interdigitated and optimized to minimize electrical resistance and carrier recombination.

Disadvantages of an EWT design that uses laser-drilled holes to make conductive vias is the need for drilling a large number of holes (e.g., 600 holes/in$^2$), and the added cost and manufacturing time of performing the laser-drilling step. Additionally, the conductivity of the laser-drilled vias may be limited by the achievable concentration of n-type dopant, and by the depth of the emitter diffusion layer realized on the interior surfaces of the laser-drilled holes. In other words, the performance of laser-drilled/diffused EWT cells is limited by the need to perform a single heavy diffusion to achieve sufficiently high conductivity in the laser-drilled vias.

Certain embodiments of the present invention use a gradient-driven migration process (e.g., thermomigration or electromigration) to create a conductive channel (i.e., via) in a single step, rather than a two-step process that laser-drills an array of holes followed by phosphorus doping to make it conductive. Simultaneous fabrication of an array of closely-spaced conductive vias using a gradient-driven migration process (as in the present invention) would reduce the cost and time needed to fabricate a back-contacted solar cell, since multiple vias can be fabricated simultaneously (rather than waiting for each hole to be individually laser-drilled, one-at-a-time). The equipment for performing thermomigration is less expensive than the equipment used for laser drilling. Also, the use of thermomigration may also produce vias with higher conductivity, as compared to laser drilled-holes.

Finally, a thermomigrated back-contacted cell can have a more optimally-doped front surface for higher conversion efficiency. In standard front-contacted cells, the front emitter must be doped heavily enough to achieve low contact resistance. Some photocurrent is lost in heavily doped emitters due to increased recombination losses in the emitter. The simplest process sequence for a back-contacted cell using an EWT geometry and laser-drilled holes uses a heavy emitter diffusion to minimize series resistance inside the holes and contact resistance to the grid. In a back-contact cell using thermomigration vias, the front surface $n^+$ diffusion and the conductive via doping can be performed in separate steps—so each step can be separately optimized. Hence, a more optimally-doped front surface comprising a lower doping concentration can be used for thermomigrated cells, which results in increased photocurrent collection.

Another advantage of thermomigrated vias is lower series resistance. A thermomigrated conductive via provides lower series resistance compared to diffused holes in the EWT cell because it is a solid cylinder that is doped, while the EWT cell only has a thin surface n+ diffusion in the walls of the laser-drilled holes. If the thermomigration metal is left in place after the thermomigration, it should yield a much lower contact resistance, as well. Finally, if the thermomigrated via is a pattern of lines rather than holes, losses due to current flow in the emitter is reduced. Also, if the thermomigrated via pattern is a pattern of lines, the thermomigration metal on the rear surface may be left on the surface and used as the n-type grid.

Thermomigration (i.e., Soret effect) is a gradient-driven migration process that refers to the movement of a liquid solute (e.g., drop, droplet, wire) through a solid host in the presence of a temperature gradient (i.e., thermal gradient). The physics of the process involves more-rapid dissolution of the solid host at the front (hot) surface of the liquid drop, which causes a supersaturation of the solute at the rear (cold) surface of the liquid drop where it is deposited. In other words, liquid droplets (typically, metals) migrate inside a solid host in the direction up the thermal gradient (migrating from cold to hot) because atoms of the solid host dissolve into the liquid at the hot interface of the droplet, diffuse across the droplet, and deposit on the cold interface of the droplet. The resulting flux of dissolved solid host atoms from the hot to the cold side of the liquid droplet causes the droplet to migrate in the opposite direction, namely, towards the hot end of the host. For metallic droplets, the minimum temperature of the semiconductor substrate must be above the semiconductor/metal eutectic temperature for thermomigration to work.

Using the process of thermomigration, sheets, wires, or drops of a suitable metallic liquid can move through the bulk of a semiconductor material under the influence of a thermal gradient, leaving behind a trail comprising recrystallized solid host material doped with a solid solution of dopant material left behind by the passage of the liquid phase. Thermomigration can form conductive channels (vias) of heavily doped silicon if the liquid metal droplet contains (or is) a dopant having opposite polarity of the substrate. Thermomigration, also called temperature gradient or Thermal Gradient Zone Melting (TGZM), of fine droplets and planar zones has been shown to be a stable process when the dimensions of these zones are sufficient small. The TGZM process was first patented by Pfann in 1957. See also H. E. Cline and T. R. Anthony, Journal of Applied Physics, Vol. 47, No. 6, June 1976. Cline and Anthony have measured aluminum-rich liquid wires and dots/droplets migrating through n-type silicon at 1200 C. with an applied thermal gradient of about 50° C./cm at a velocity of about 1 mm/hour. In this experiment, the recrystallized silicon deposited behind the migrating aluminum-rich droplet was doped sufficiently high with a residual solid solution of aluminum (n-dopant) to convert the original n-type silicon matrix/host to p-type silicon inside of the recrystallized columnar/cylindrical droplet trail that was left behind. It is known that aluminum, gold, and germanium can be thermomigrated through silicon, germanium, or gallium arsenide.

Thermomigration has been used to fabricate p-n junctions in solar cells. See, for example, U.S. Pat. No. 3,936,319 to Anthony, et al.; U.S. Pat. No. 4,190,852 to Warner; and U.S. Pat. No. 4,173,496 to Chaing, et al. However, this technique has not been used to fabricate completely back-contacted solar cells.

In a gradient-driven transport process, such as thermomigration (or electromigration), a gradient in temperature (or electric field) determines the direction for transporting/migrating the solute material. In the fabrication of silicon solar cells, the direction of the thermal gradient is typically oriented across the thickness of the silicon substrate/wafer (i.e., in a direction perpendicular to the plane of the silicon substrate). Such a thermal gradient can be produced by heating one side of the substrate, rather than both sides (which would produce a uniform temperature).

In typical semiconductor production lines, the temperature of a silicon wafer sometimes needs to uniformly increased rapidly, and then held for a short period of time, e.g., 60 seconds, for annealing or diffusion treatments. This is often accomplished by using Rapid Thermal Processing (RTP) equipment, which typically consists of a double-sided bank of tungsten halogen quartz heating lamps that heat both sides of the wafer uniformly, so that there is essentially no temperature variation across the wafer or through its thickness. Unacceptably large temperature variations would create non-uniform annealing rates, diffusion rates, etc. and may result in poor reliability, reduced yield, etc. Hence, RTP equipment is carefully designed to heat the silicon wafers as uniformly as possible; and to minimize any temperature gradients across the thickness of a wafer.

Electromigration is another type of gradient-driven migration process, similar to thermomigration that can be used to move metal droplets through a semiconductor material. For more details, see U.S. Pat. No. 4,377,423 to Anthony, which is incorporated herein by reference. In this process, an electric field gradient (potential) provides the driving force for moving liquid metal droplets through the thickness of a semiconductor material, such as liquid aluminum drops through silicon.

What is needed, however, is an economical and reliable process that uses thermomigration (or some other type of gradient-driven solute transport technique, such as electromigration) to create an array of closely-spaced $n^{++}$ conductive vias that electrically connect an n+ emitter layer on the front surface of a solar cell to ohmic contacts located on the cell's backside. Against this background, the present invention was developed.

SUMMARY OF THE INVENTION

The present invention relates generally to methods of manufacturing photovoltaic silicon solar cells, and more specifically to back-contacted silicon solar cells fabricated using a gradient-driven solute transport process, such as thermomigration or electromigration, to create an array of closely-spaced $n^{++}$ conductive vias that electrically connect a $n^+$ emitter layer on the front surface of a solar cell to ohmic contacts located on the cell's backside.

BRIEF DESCRIPTION OF THE DRAWINGS

The accompanying drawings, which are incorporated in and form part of the specification, illustrate various examples of the present invention and, together with the detailed description, serve to explain the principles of the invention.

DETAILED DESCRIPTION OF THE INVENTION

Figure 1A:
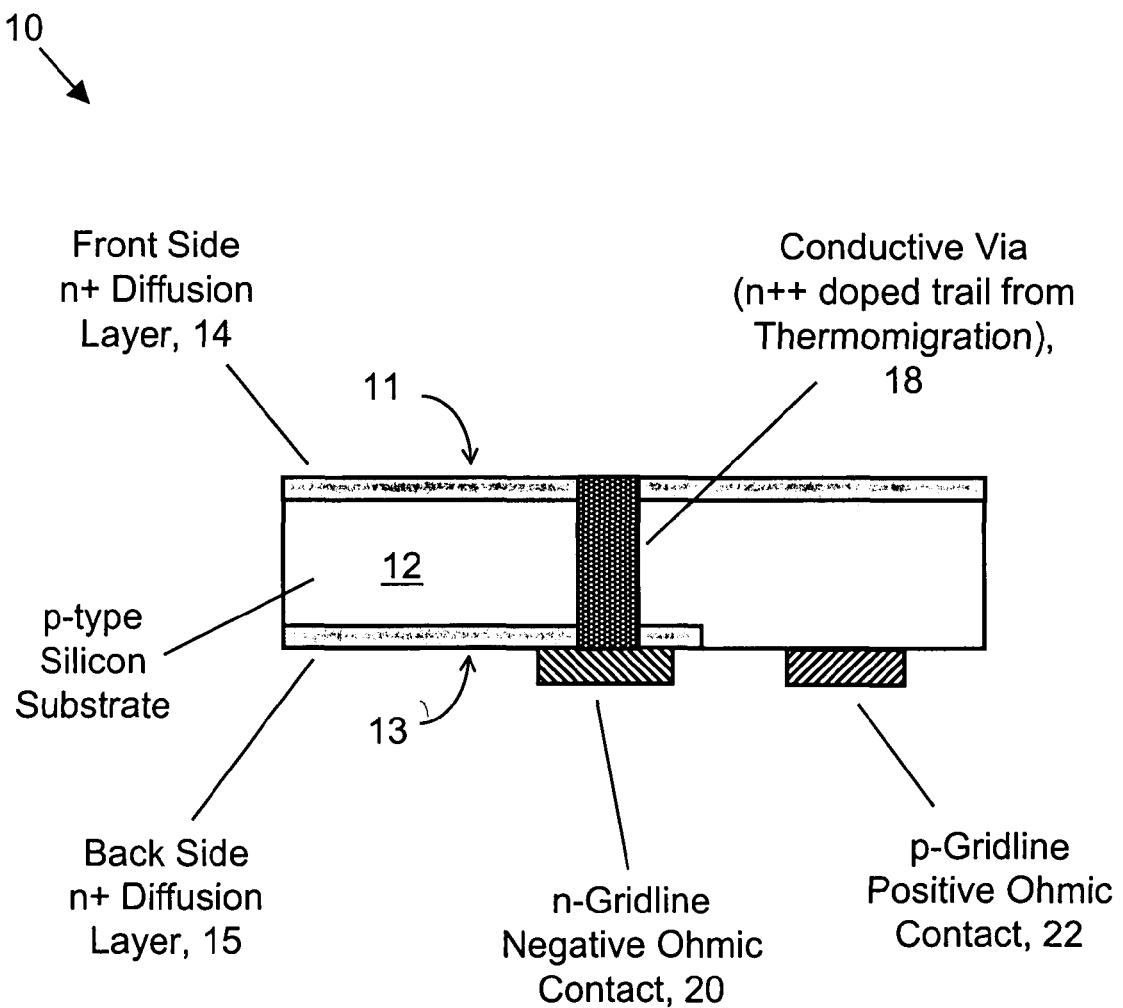
FIG. 1A shows a schematic cross-section side view of a first example of a back-contacted silicon solar cell, according to the present invention.

Note that in the drawings, the thicknesses of the various layers of insulating, semiconducting, and metallic materials; and other dimensions, such as the width of contact pads, are not drawn to scale, but, rather, are shown schematically for purposes of illustration and easy identification.

FIG. 1A shows a schematic cross-section side view of a first example of a back-contacted silicon solar cell, according to the present invention. Back-contacted solar cell 10 comprises a p-type bulk silicon substrate 12; a front side $n^+$ diffusion emitter layer 14 located on the front side 11 of substrate 12; a backside $n^+$ diffusion emitter layer 15 located on the backside 13 of substrate 12; a n-gridline negative ohmic contact 20 located on the backside 13 of substrate 12, contacting backside emitter layer 15; a $n^{++}$ conductive via 18 disposed through the thickness of substrate 12 that electrically connects front side emitter layer 14 to negative ohmic contact 20 located on backside 13 and a p-gridline positive ohmic contact 20 located on back side 13 that is electrically connected to p-type silicon substrate 12. Conductive via 18 also contacts backside emitter layer 15. Front side $n^+$ diffusion emitter layer 14 may comprise a phosphorus $n^+$ diffusion layer. In one embodiment, front side emitter layer 14 may be lightly n-doped, while backside $n^+$ emitter 15 may be heavily doped. Alternatively, in another embodiment, both emitter layers 14 and 15 are n-doped approximately the same amount. Conductive via 18 may comprise a recrystallized $n^{++}$ doped trail that has been formed after gradient-driven migration completely through substrate 12 of a solute material that is or contains $n^{++}$ dopant material. The gradient-driven migration process may comprise thermomigration (e.g., TGZM), electromigration, or a combination of both. The direction of gradient-driven migration may be from the front side 11 towards backside 13, or, alternatively, may be from backside 13 towards front side 11. Both n-type and p-type ohmic contacts 20 and 22 are located on the backside 13 of substrate 12. Conductive via 18 is a solid member (e.g., cylinder, rod, plane) and is not a hollow, laser-drilled hole. A dielectric layer (not shown) may be added to backside 13 to electrically isolate n-grid 20 from p-type substrate 12 and from p-grid 22.

Figure 1B:
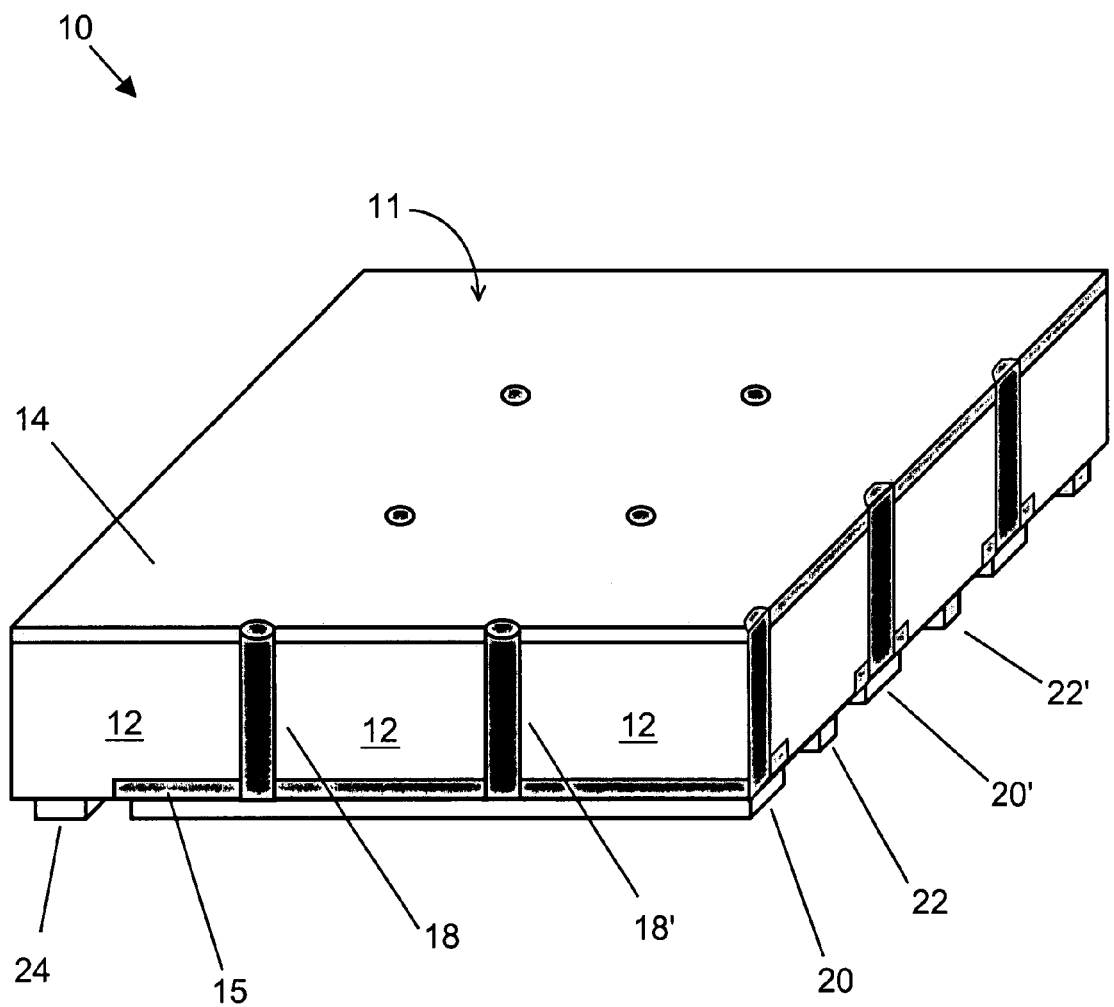
FIG. 1B shows a schematic isometric view of the first example of a back-contacted silicon solar cell, according to the present invention.

FIG. 1B shows a schematic isometric view of the first example of a back-contacted silicon solar cell, according to the present invention. The reference numbers are the same as in FIG. 1A. Back-contacted solar cell 10 comprises a closely spaced array of conductive vias 18,18', etc. fabricated by a gradient-driven migration process. The spacing between adjacent conductive vias 18,18', etc. can be from 1–2 mm, and the diameter of conductive vias 18, 18', etc. can be from 25–150 microns. n-gridlines 20, 20', etc. and p-gridlines 22, 22', etc. are interdigitated on backside 13, and optimized to minimize electrical resistance and carrier recombination. P-busbar 24 connects individual p-gridlines 22, 22', etc. An n-type busbar is not shown in this view.

Figure 1C:
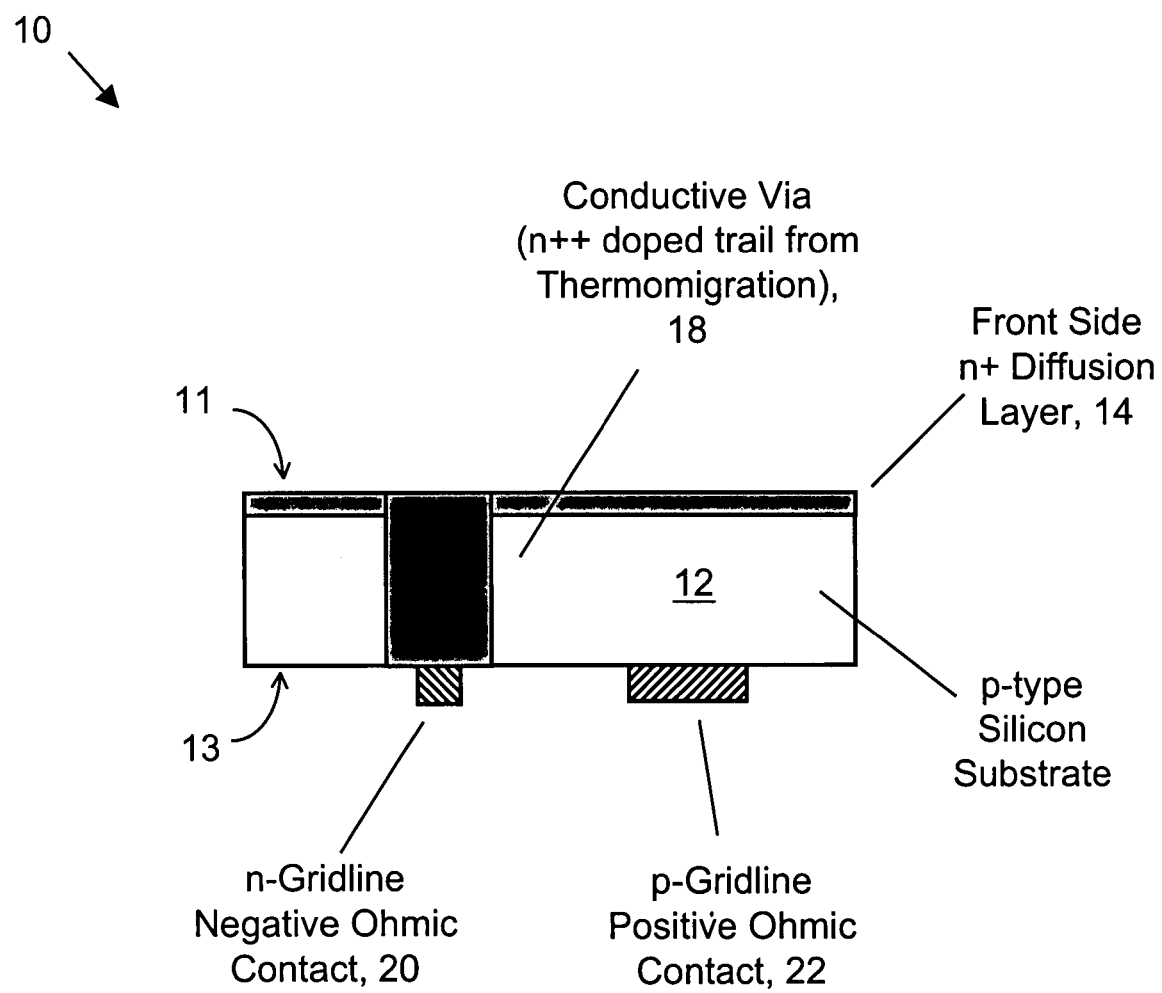
FIG. 1C shows a schematic cross-section side view of a second example of a back-contacted silicon solar cell, according to the present invention.
Figure 1D:
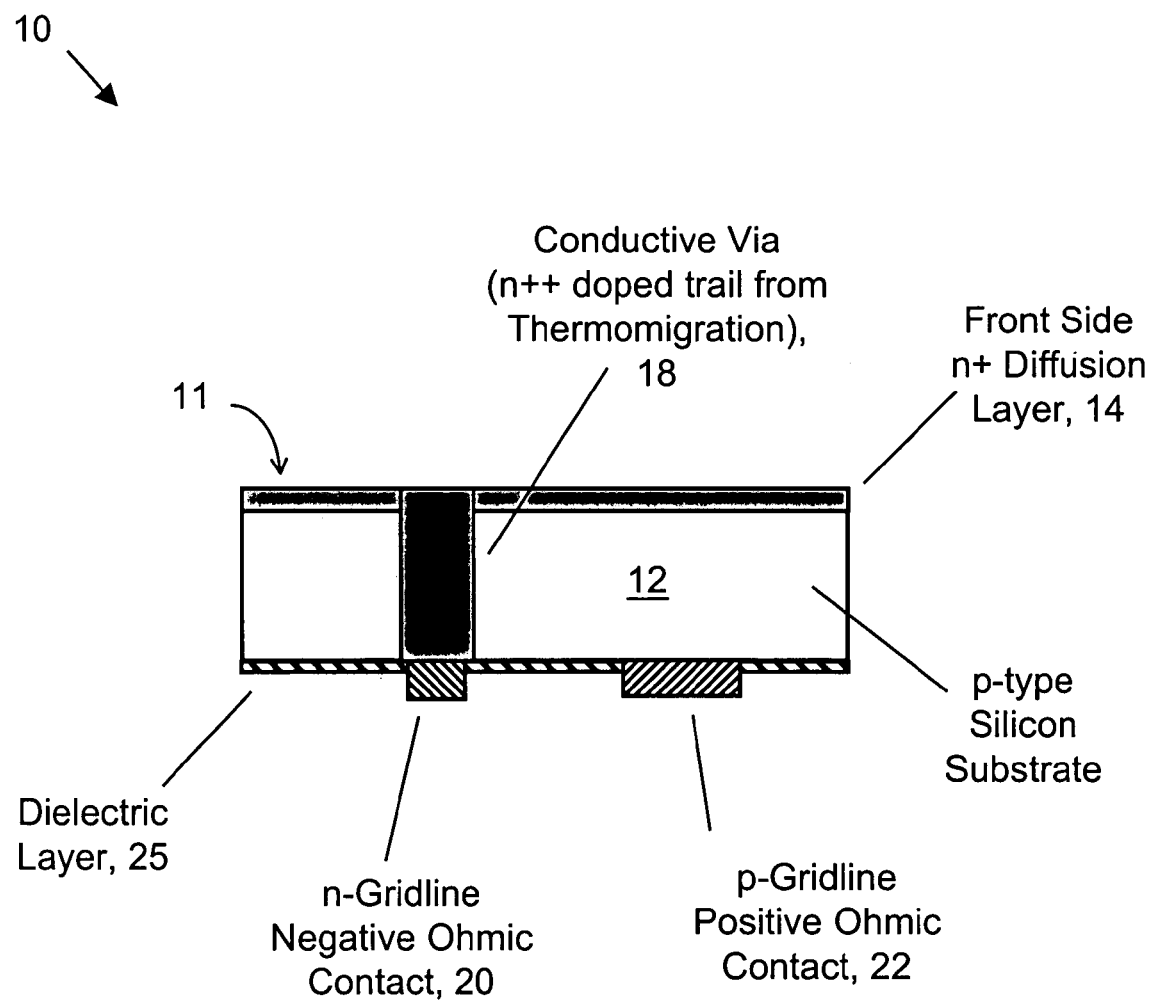
FIG. 1D shows a schematic cross-section side view of a third example of a back-contacted silicon solar cell, according to the present invention.

FIG. 1C shows a schematic cross-section side view of a second example of a back-contacted silicon solar cell, according to the present invention. The reference numbers are the same as in FIGS. 1A and 1B. However, in this embodiment, there is no backside n+ diffusion emitter layer. Also, conductive via 18 is much wider than n-grid contact 20, to prevent shorting between n-grid contact 20 and p-type substrate 12. In this embodiment, conductive via 18 may comprise a wide line or stripe of metal (e.g., >100 microns), rather than a droplet.

There are several methods by which these back-contacted cells can be made, and variations of those examples specifically discussed herein are possible.

Figure 2A:
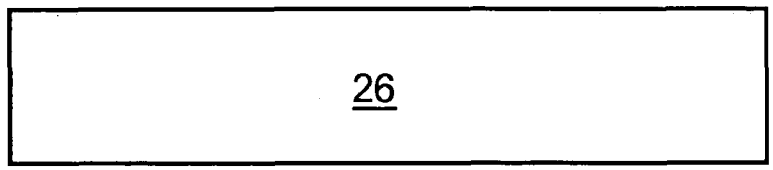
FIGS. 2A–2J show a schematic cross-section side view of a first example of a sequence of process steps for fabricating a back-contacted silicon solar cell using a gradient-driven migration process, according to the present invention.
Figure 2B:
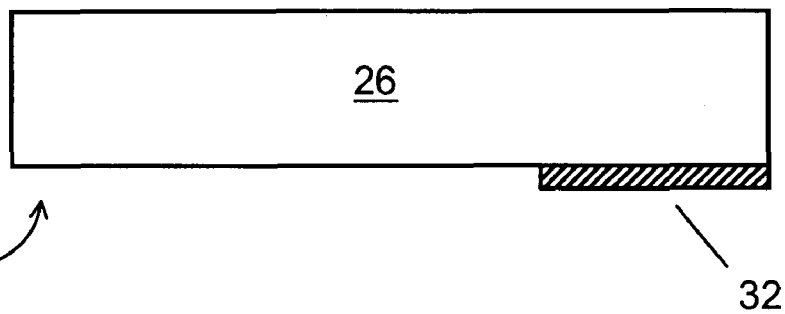
Figure 2C:
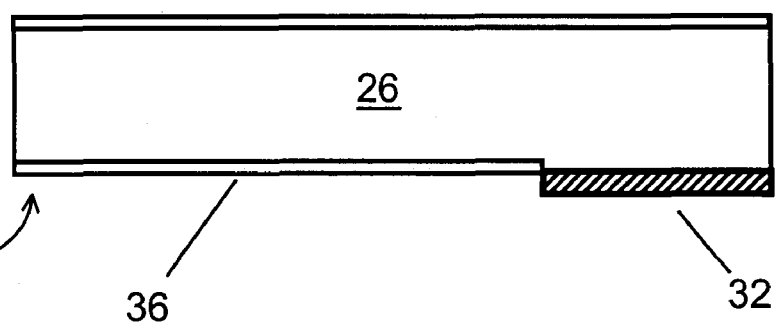
Figure 2D:
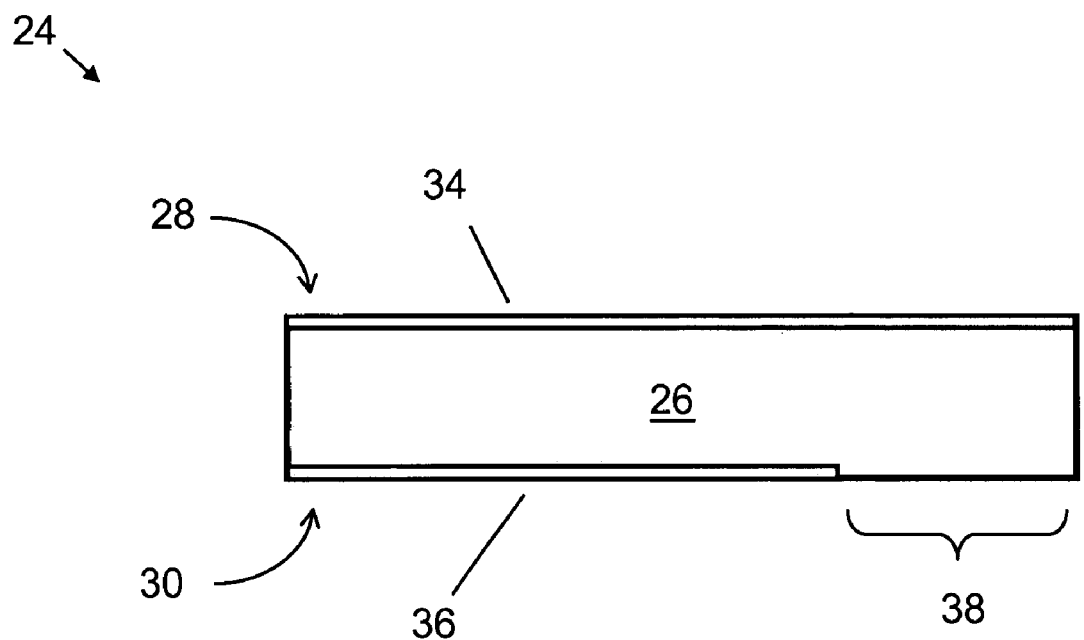

FIGS. 2A–2J show a schematic cross-section side view of a first example of a sequence of process steps for fabricating a back-contacted silicon solar cell 24 using a gradient-driven migration process, according to the present invention. In FIG. 2A a thin, p-type bulk silicon substrate 26 is provided. Then, the wafer is cleaned and etched. Next, in FIG. 2B, a patterned diffusion barrier 32 is created to mask off a portion of the backside 30 of substrate 26. Diffusion barrier 32 may comprise an oxide layer that is screen-printed (e.g., $SiO_2$), or may comprise a deposited layer, such as $Si_3N_4$ or other suitable material deposited by PECVD, APCVD, or other means, and subsequently patterned by screen printing a resist and performing an etch. Next, in FIG. 2C, a phosphorous diffusion step is performed (e.g., $POCl_3$), which creates a front side $n^+$ emitter layer 34 and a backside $n^+$ emitter layer 36. The presence of diffusion barrier 32 prevents the underlying area of substrate 26 from being doped with phosphorus. Next, in FIG. 2D, diffusion barrier 32 is removed, for example, by performing a hydrofluoric acid etch. This exposes an undoped area 38 of p-type silicon substrate 26 that subsequently will be covered with an ohmic contact gridline.

Figure 2E:
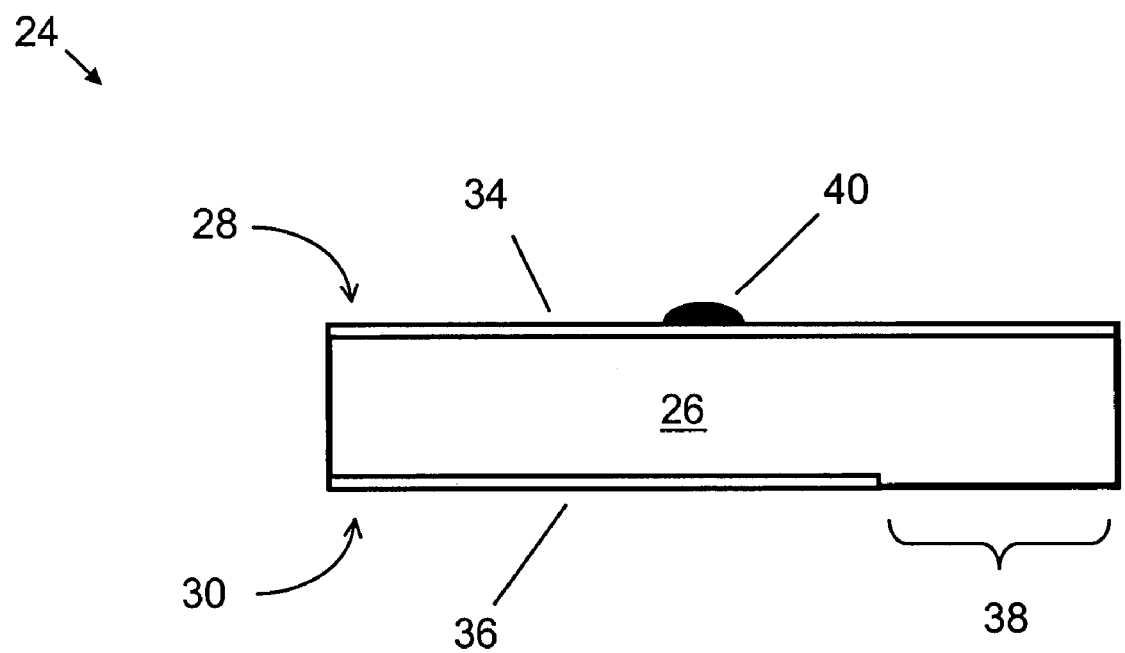

Next, in FIG. 2E, metal carrier droplet 40, which contains (or inherently is) an n-type dopant material, is deposited on top of front side $n^+$ emitter layer 34. Carrier droplet 40 may be deposited by a wide variety of deposition methods, including, but not limited to: screen printing, ink jet printing, evaporation, sputtering, CVD, PECVD, cold-spray deposition (kinetic deposition of metal powders), plasma-arc spray deposition, LIGA, electroplating, electroless plating, and combinations thereof. An array of closely-spaced droplets (see, e.g., FIG. 1B) may be simultaneously deposited. Optionally, a shallow "pit" or depression (not shown) for holding droplet 40 may be laser-drilled, chemically etched, or created some other way, prior to depositing droplet 40. Then, the shallow pit may be filled with the solute metal by screen printing without using a screen, i.e., by using a squeegee to push metal-loaded paste across the surface, which fills in the shallow pits. Use of a shallow pit may help to improve the reliability of the subsequent thermomigration process by improving the wetting properties, and by holding and centering the melted metal droplet 40 in a well-defined depression. Otherwise, the molten droplet 40 could move around the surface a little before wetting and penetrating silicon substrate 26. Optionally, a thin dielectric layer (e.g., PECVD $Si_3N_4$) may be deposited on top of the as-deposited droplet 40 (i.e., before starting the thermomigration process), in order to help stabilize the molten droplet; prevent exaporation of the droplet; and facilitate entrance of the molten droplet in the silicon substrate 12 (as well as serving later on as an anti-reflection coating)

Figure 2F:
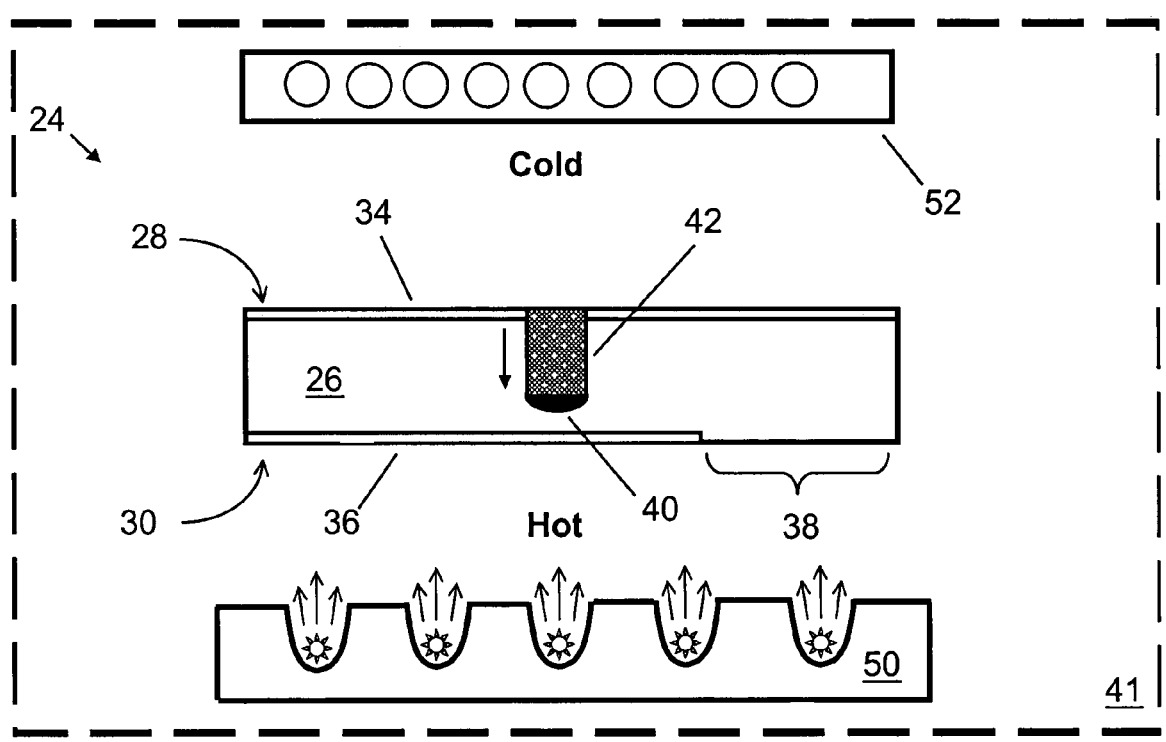

Next, in FIG. 2F, substrate 26 is placed in a specially-designed rapid thermal processor (RTP) 41, where it is heated to a temperature sufficiently high to melt droplet 40. RTP 41 also creates a temperature gradient through the substrate's thickness. Thermomigration is faster with larger thermal gradients and with higher average temperatures. A typical temperature gradient may be about 50° C./cm. This may be accomplished, for example, by heating backside 30 with a bank of tungsten halogen or plasma arc lamps 50 and by cooling the front side 28 by using a water or gas-cooled heat sink 52 with a blackened, radiation-absorbing surface. The temperature gradient created through the thickness of substrate 26 drives the movement of molten droplet 40 in a direction towards the hotter side (e.g., towards backside 30) according to the process of thermomigration (or electromigration using an electric field gradient). The recrystallized, cylindrical zone 42 that forms after the passages of droplet 40 comprises a sufficiently high residual concentration of $n^{++}$ dopant left behind in droplet's trail to make via 42 electrically conductive with respect to n-type emitter layers 28 and 30, while also being electrically insulating with respect to p-type bulk silicon substrate 26. Rapid thermal processor 41 may use a high power plasma arc lamp, such as an argon arc lamp manufactured by Vortek, Inc. of Vancouver BC, Canada, which produces an intense beam of light having a spectrum with a large percentage of UV/visible light, as opposed to a tungsten halogen lamp which produces mostly IR light. The large percentage of UV/visible light produced by an argon plasma arc lamp couples more efficiently into the silicon substrate (and, thus, heats it more rapidly and efficiently), because silicon is highly absorbing in the UV, but not in the IR spectrum.

The thermomigration metal used for droplet 40 must dope the silicon n-type (e.g., $n^{++}$) in order to form a conductive channel between the phosphorus diffusion layers on the front and rear surfaces. Examples of suitable n-type dopant metals include phosphorus, arsenic, and antimony, and combinations or alloys thereof. These dopant metals can be used either in their elemental form, or can be combined, alloyed, or mixed with a carrier metal that forms an eutectic phase with silicon at relatively low temperatures. Examples of suitable carrier metals include silver, platinum, gallium, magnesium, indium, aluminum, tin, copper, and gold, and combinations or alloys thereof (e.g., silver/aluminum, silver/tin). Alternatively, ternary alloys may be used for carrier droplet 40. For example, silver-gold-antimony and silver-tin-antimony may be used to dope silicon n-type. Silver-aluminum-antimony may be used to dope silicon either n-type or p-type, depending on the TGZM process temperature and droplet composition. Ag-10 at % Sb-10 at % Al at 1200 C. dopes silicon n-type. In general, however, the TGZM process should be practiced at a temperature greater than the temperature at which intermetallic compounds are formed between the material of the semiconductor body and either the dopant material and/or carrier droplet material.

For a semiconductor substrate made of germanium, examples of suitable n-type dopant metals include phosphorus, antimony, and arsenic. Examples of suitable carrier droplet metals include lead, silver, cadmium, thallium, zinc, tin, gold, and indium. Additional information about suitable dopant/carrier metal combinations can be found in U.S. Pat. No. 4,184,897 to Anthony, which is included herein by reference.

Figure 2G:
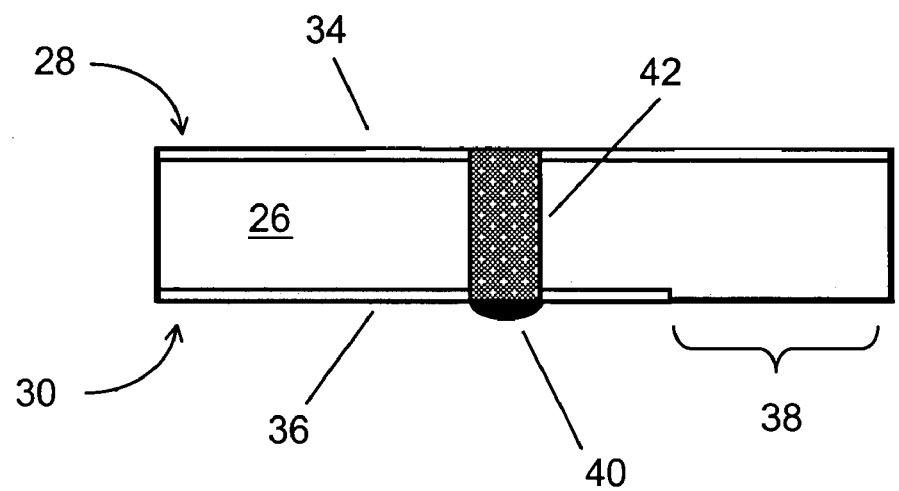

Next, in FIG. 2G, metal droplet 40 has thermomigrated completely through substrate 26 and re-emerged on the backside surface 30. By penetrating through backside emitter layer 36, $n^{++}$ doped conductive via 18 thereby electrically connects front side emitter layer 34 to backside emitter layer 36.

Figure 2H:
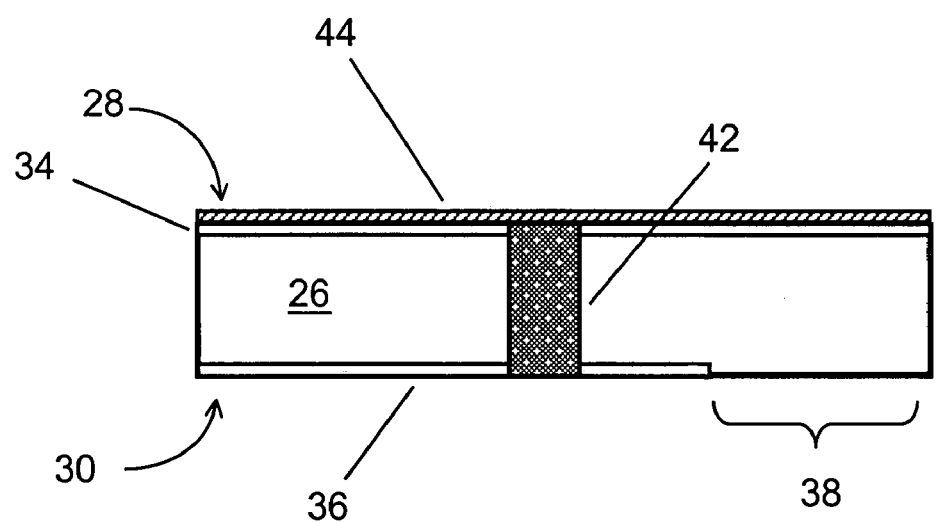

Next, in FIG. 2H, re-emerged droplet 40 is removed, e.g., by mechanical polishing. Alternatively, re-emerged droplet 40 can be left in place and not removed, where it can form part or all of a backside ohmic contact. Also, in FIG. 2H, a protective coating 44 of silicon nitride or other suitable protective material is deposited on the front side 28 of cell 24, thereby covering emitter layer 34. Silicon nitride coating 44 may be deposited, for example, by plasma-enhanced chemical vapor deposition (PECVD), or other techniques well-known in the art. Coating 44 may comprise a $SiN_x$ antireflection (ARC) coating. Coating 44 can be used as an anti-reflection coating, and can also provide surface passivation and some passivation of bulk defects. Alternatively, layer 40 may comprise a $TiO_2$ antireflection coating deposited by atmospheric-pressure CVD, spray pyrolysis, screen printing, or other techniques. $TiO_2$ ARC films generally produce less efficient solar cells than PECVD $Si_3N_4$ ARC films because the $TiO_2$ films do not provide any passivation of surface or bulk defects.

Figure 2I:
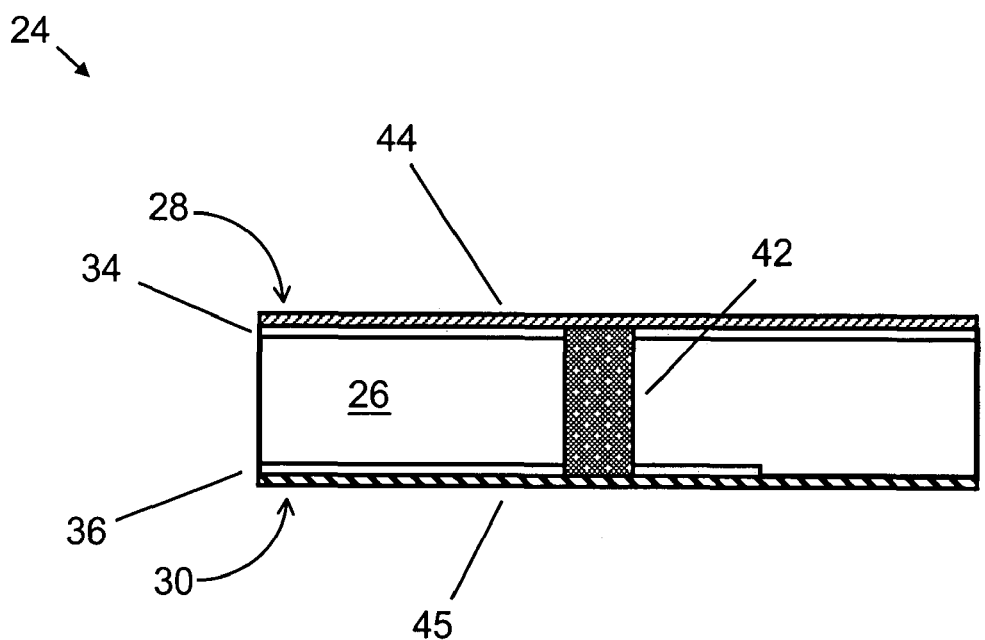

Next, in FIG. 2I, an optional dielectric passivation layer 45 can be applied to the backside of cell 24, prior to depositing the ohmic contacts, so as to prevent shorting or shunting between the contacts. An ideal surface passivation layer for an EWT cell would minimize surface recombination, as well as surface conductance channels. Various dielectric layers with good surface passivation properties (e.g., deposited $SiN_x$, deposited $SiO_2$, or thermally grown $SiO_2$) can be used for rear-surface passivation layer 45. Note that passivation layer 45 may be patterned, or not, depending on the method subsequently used to fabricate the ohmic contacts (as described below).

Figure 2J:
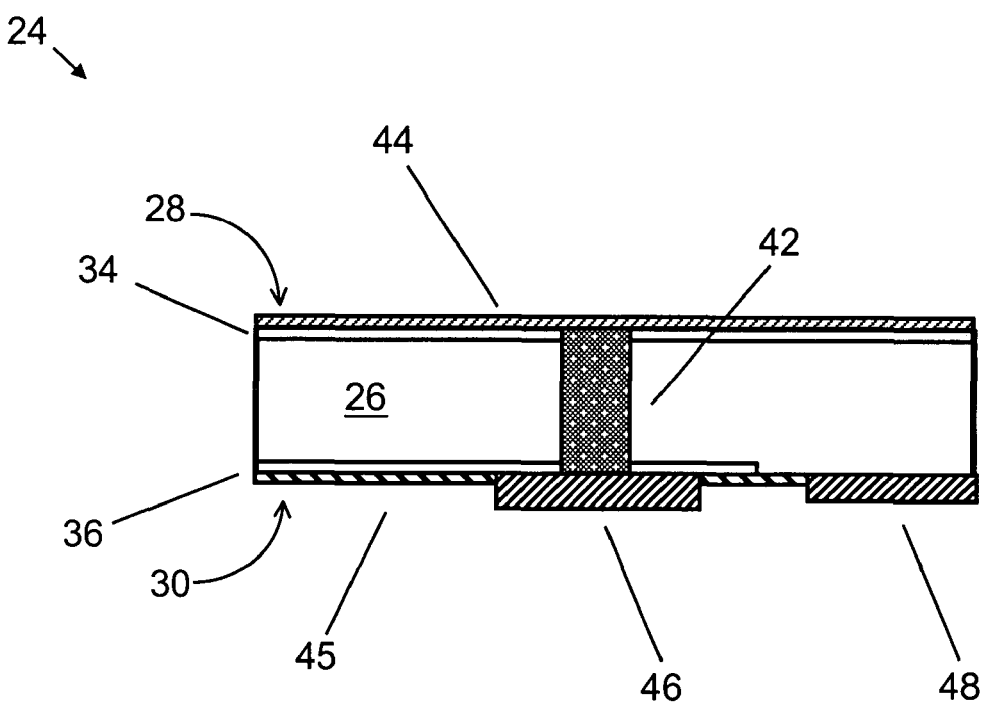

Finally, in FIG. 2J, n-gridline negative ohmic contact 46 and p-gridline positive ohmic contact 48 are fabricated. These contacts are generally arranged in an interdigitated pattern, and may be applied by evaporation; screen-printing of pastes containing silver, aluminum, or silver-aluminum compounds; or other well-known techniques, such as electroless plating, etc. For example, screen-printed aluminum or silver/aluminum paste can be used to form the p-contacts 48 and screen-printed silver can be used to form the n-contacts 46. After printing, the contacts can be co-fired in a belt furnace at approximately 730 C to promote good contact to silicon. If passivation layer 45 has been previously applied prior to contact printing, and if passivation layer 45 has not been patterned, then it will be necessary to break through layer 45 in the areas where ohmic contacts need to be made to the underlying conductive surfaces. This can be accomplished, for example, by using a Ag-paste that includes some aggressive oxide frit particles to help etch though any surface oxides used for layer 45 and attach the Ag-particles to the underlying surface. Ag-paste vendors provide special compositions for firing a Ag-grid through a 70-nm thick $SiN_x$ layer. Use of such a special paste composition may eliminate the need to mask or pattern rear-surface passivation layer 45; however, this approach tends to limit the thickness of layer 45.

The fabrication steps illustrated in the first example shown in FIGS. 2A–2J can be summarized as follows:
  1. Provide thin p-type silicon substrate
  2. Clean and etch silicon
  3. Screen-print oxide for diffusion barrier
  4. Phosphorus diffusion
  5. Remove oxide (e.g., hydrofluoric acid etch)

7. Screen-print array of thermomigration metal droplets
8. Perform thermomigration in a special designed rapid thermal processor
9. Deposit silicon nitride by plasma-enhanced CVD on front surface for antireflection coating
10. Screen-print silver paste for negative-polarity n-contact
11. Screen-print silver paste for positive-polarity p-contact
12. Fire contacts for good contact to silicon
13. Test solar cell.

In the first example of a fabrication process illustrated in FIGS. 2A–2J, the direction of thermomigration for droplet 40 is from front surface 28 to rear surface 20 (i.e., from cold to hot). The choice of this direction is useful if the re-emerged droplet 40 is not removed and is used for an ohmic contact. However, if the re-emerged droplet is going to be removed, then it is possible to reverse the direction of thermomigration by creating a thermal gradient in the opposite direction. In this case, the rapid thermal processor would be operated to make the front surface 28 hotter than the rear surface 30. Also, the initial metal droplet 40 would be deposited on the rear surface 30. Therefore, thermomigration of droplet 40 would be in the direction towards the hotter front surface 28, and, eventually, droplet 40 would re-emerge on to the front surface 28, where it would be removed.

Figure 3A:
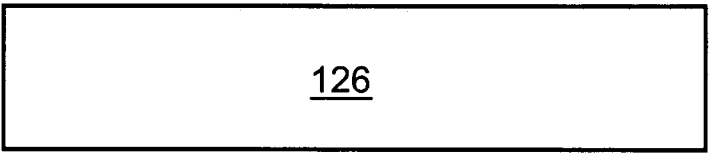
FIGS. 3A–3E show a schematic cross-section side view of a second example of a sequence of process steps for fabricating a back-contacted silicon solar cell using a gradient-driven migration process, according to the present invention.
Figure 3B:
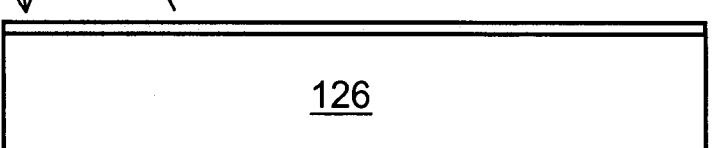

FIGS. 3A–3E show a schematic cross-section side view of a second example of a sequence of process steps for fabricating a back-contacted silicon solar cell 124 using a gradient-driven migration process, according to the present invention. In FIG. 3A a p-type bulk silicon substrate 126 is provided. Then, the wafer is cleaned and etched. Next, in FIG. 3B, a phosphorous diffusion step is performed (e.g., $POCl_3$), which creates a front side $n^+$ emitter layer 134 and a backside n+ emitter layer 136. No diffusion barrier is used in this second embodiment, unlike the first example shown previously in FIGS. 2A–2J.

Figure 3C:
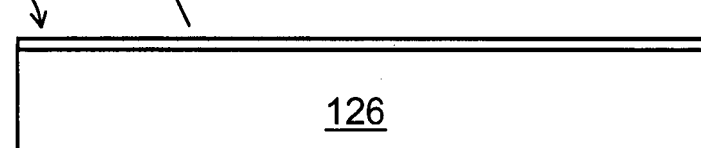

Next, in FIG. 3C, a resist layer 131 is deposited (e.g., by screen printing) on a portion of the backside 130 of substrate 126, and then dried. Resist layer 131 is patterned so that the area where the p-type ohmic contact subsequently will be placed is exposed.

Figure 3D:
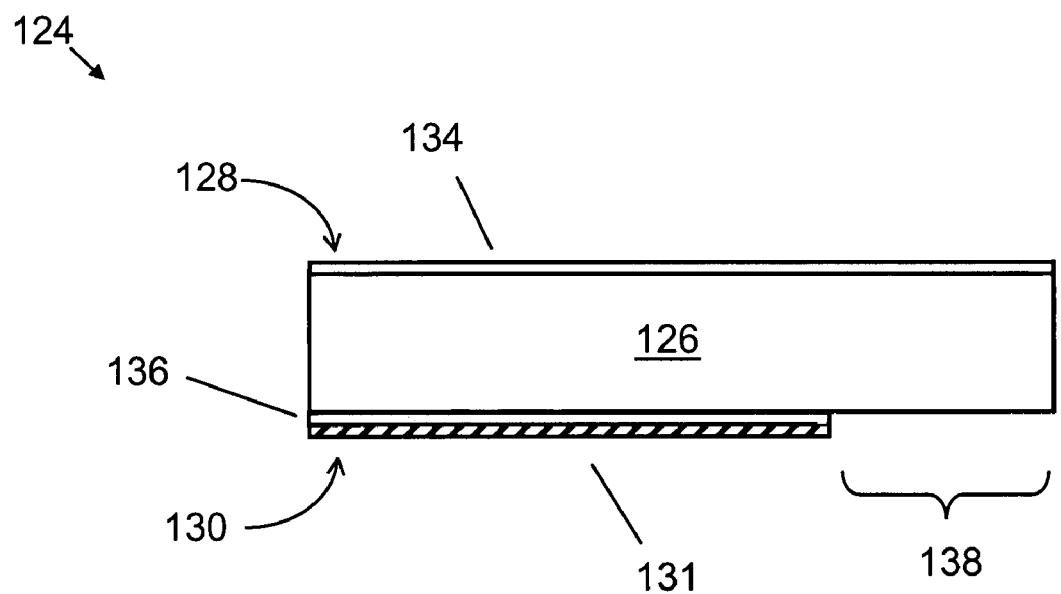

Next, in FIG. 3D, the rear surface of substrate 126 is etched (i.e., chemical etched or plasma etched) to remove that portion of the backside $n^+$ emitter layer 136 from the area 138 where the p-type ohmic contact subsequently will be placed.

Figure 3E:
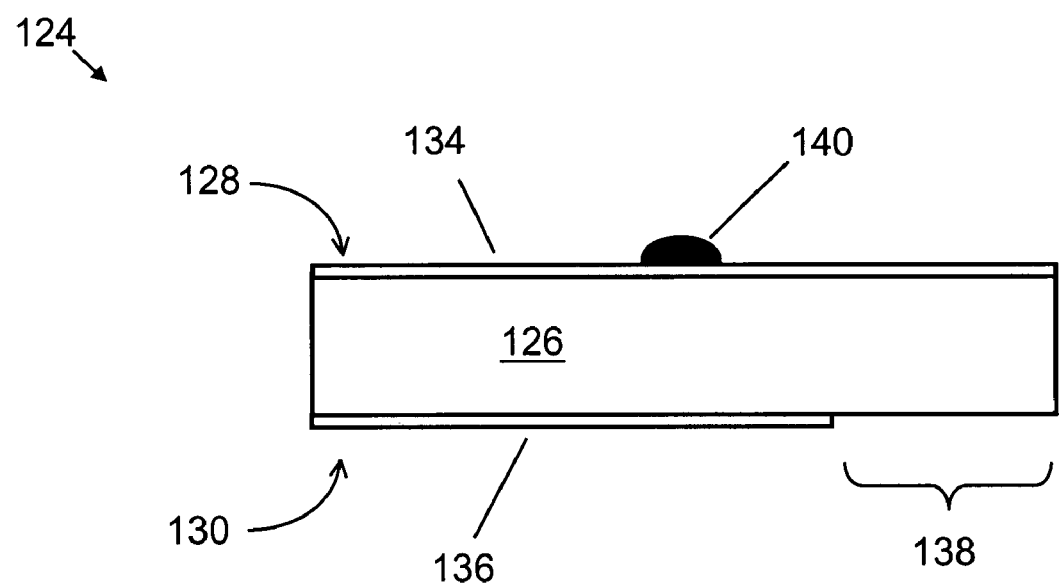

Next, in FIG. 3E, the resist layer 131 is removed, thereby exposing the backside $n^+$ emitter layer 136. Also, metal droplet 140 is deposited on top of front side $n^+$ emitter layer 134, which will be thermomigrated later to form a conductive via. At this stage, the intermediate assembly shown in FIG. 3E is identical to that shown in FIG. 2E. As such, the remaining process steps are the same as shown and described in FIGS. 2F–2J.

The fabrication steps illustrated in the second example shown in FIGS. 3A–3E can be summarized as follows:
1. Provide thin p-type silicon substrate
2. Clean and etch silicon
3. Phosphorus diffusion everywhere (no diffusion barrier)
4. Screen-print resist on the back surface, except where the area where the p-type ohmic contact will be made
5. Dry the resist
6. Remove the $n^+$ diffusion emitter layer from the region of the p-contact area (chemical etch, plasma etch)
7. Remove the resist layer
8. Screen-print array of thermomigration metal droplets
9. Perform thermomigration in a special designed rapid thermal processor
10. Deposit silicon nitride by plasma-enhanced CVD on front surface for antireflection coating
11. Screen-print silver paste for negative-polarity n-contact
12. Screen-print silver paste for positive-polarity p-contact
13. Fire contacts for good contact to silicon
14. Test solar cell.

The present invention may be practiced with semiconductor substrates other than silicon or germanium, such as: indium gallium phosphide, gallium arsenide, indium antimonide, copper indium gallium diselenide, cadmium telluride, and zinc sulfide.

The particular examples discussed above are cited to illustrate particular embodiments of the invention. Other applications and embodiments of the apparatus and method of the present invention will become evident to those skilled in the art. For example, thin lines or strips of metal, instead of small droplet, may be used to fabricate doped conductive vias using the process of thermomigration (or electromigration). Alternatively, a combination of lines and droplets (i.e., dots) may be thermomigrated (electromigrated). Alternatively, the thermomigration process can be repeated multiple times, each time adding additional carrier metal (e.g., lines or droplets). Alternatively, several closely-spaced lines (or droplets) may be thermomigrated in a same step, since the maximum practical line width of a single line (or, the maximum diameter of a droplet) that can be thermomigrated is limited by surface tension instability effects.

Those skilled in the art of silicon solar cell fabrication will appreciate that many variations in process steps can be used that are different from the examples and embodiments disclosed above, while still practicing the fundamental features of the present invention. For example, the thermomigration step may be performed before the phosphorus diffusion step.

It is to be understood that the invention is not limited in its application to the details of construction, materials used, and the arrangements of components set forth in the following description or illustrated in the drawings.

The scope of the invention is defined by the claims appended hereto.

What is claimed is:

1. A back-contacted solar cell, comprising:
   a p-type bulk semiconductor substrate, having a front side and a backside;
   a front side $n^+$ diffusion emitter layer located on the front side of the semiconductor substrate;
   a n-gridline negative ohmic contact located on the backside of the semiconductor substrate;
   a solid $n^{++}$ doped conductive via disposed through the thickness of the semiconductor substrate that electrically connects the front side n+ emitter layer to the negative ohmic contact located on the backside of the semiconductor substrate; and
   a p-gridline positive ohmic contact located on the back side of the semiconductor substrate;
   wherein the conductive via comprises a recrystallized $n^{++}$ doped trail that has been formed after a surface-deposited solute material has migrated completely through the semiconductor substrate from one side to the other, driven by a gradient-driven migration process; and
   wherein the solute material is, or contains, an $n^{++}$ dopant material.

2. The solar cell of claim 1, wherein the gradient-driven migration process comprises a thermomigration process, an electromigration process, or a combination of both.

3. The solar cell of claim 1, wherein the front side $n^+$ diffusion emitter layer comprises a phosphorus $n^+$ diffusion layer.

4. The solar cell of claim 1, further comprising a backside $n^+$ diffusion emitter layer located on the backside of the semiconductor substrate.

5. The solar cell of claim 4, wherein the front side n+ diffusion emitter layer is lightly doped, and the backside $n^+$ diffusion emitter layer is heavily doped.

6. The solar cell of claim 4, further comprising a passivation layer disposed on the back surface of the semiconductor substrate, and disposed in-between the positive and negative ohmic contacts.

7. The solar cell of claim 1, further comprising an anti-reflection coating disposed on the front surface of the semiconductor substrate, covering the front side n+ diffusion emitter layer and the front side of the conductive via.

8. The solar cell of claim 1, wherein the solute material comprises one or more n-type dopant materials selected from the group consisting of phosphorus, arsenic, and antimony.

9. The solar cell of claim 8, wherein the solute material additionally comprises one or more carrier metals selected from the group consisting of platinum, gallium, magnesium, indium, silver, copper, aluminum, tin, and gold.

10. The solar cell of claim 9, wherein the solute material comprises one or more ternary alloys selected from the group consisting of silver-gold-antimony, silver-tin-antimony, and silver-aluminum-antimony.

11. The solar cell of claim 10, wherein the solute material comprises silver with about 10 at. % antimony and about 10 at % aluminum.

12. The solar cell of claim 1, further comprising an array of closely-spaced, solid $n^{++}$ doped conductive vias made by a gradient-driven migration process.

13. The solar cell of claim 12, wherein the spacing between adjacent conductive vias is from about 1 mm to about 2 mm.

14. The solar cell of claim 12, wherein the diameter of the conductive vias is from about 25 microns to about 150 microns.

15. The solar cell of claim 1, wherein the semiconductor substrate comprises one or more semiconducting materials selected from the group consisting of silicon, germanium, indium gallium phosphide, gallium arsenide, indium antimonide, copper indium gallium diselenide, cadmium telluride, and zinc sulfide.

* * * * *